(12) United States Patent
Hanselmann

(10) Patent No.: US 6,593,824 B2
(45) Date of Patent: Jul. 15, 2003

(54) PROCESS FOR REDUCING THE DECAY AND TRANSIENT TIMES OF OSCILLATING CIRCUITS

(75) Inventor: Dieter Hanselmann, Oehringen (DE)

(73) Assignee: ATMEL Germany GmbH, Heilbronn (DE)

(*) Notice: Subject to any disclaimer, the term of this patent is extended or adjusted under 35 U.S.C. 154(b) by 0 days.

(21) Appl. No.: 09/842,612

(22) Filed: Apr. 26, 2001

(65) Prior Publication Data

US 2001/0054935 A1 Dec. 27, 2001

(30) Foreign Application Priority Data

Jun. 24, 2000 (DE) .......................... 100 30 952

(51) Int. Cl.$^7$ ................................ H03L 5/00
(52) U.S. Cl. .................... 331/117 R; 331/74
(58) Field of Search ................ 331/117 R, 74, 331/14, 55, 167

(56) References Cited

U.S. PATENT DOCUMENTS

| | | | | | |
|---|---|---|---|---|---|
| 3,949,388 A | * | 4/1976 | Fuller | .................. | 128/903 |
| 3,991,388 A | * | 11/1976 | Harshbarger | ............ | 331/117 R |
| 4,199,734 A | * | 4/1980 | Dressen | ................. | 331/116 R |
| 4,236,523 A | * | 12/1980 | Gruenenwald | .............. | 128/904 |
| 4,453,162 A | | 6/1984 | Money et al. | ......... | 340/870.39 |
| 4,617,534 A | | 10/1986 | Lill | ........................ | 331/117 R |

FOREIGN PATENT DOCUMENTS

| DE | 3248010 | 11/1983 |
|---|---|---|
| DE | 3733943 | 4/1989 |

OTHER PUBLICATIONS

"Functional Description", U2270B, Rev.A4, Nov. 19, 1998., Temic Semiconductors: p. 404.

* cited by examiner

Primary Examiner—Robert Pascal
Assistant Examiner—Joseph Chang
(74) Attorney, Agent, or Firm—W. F. Fasse; W. G. Fasse

(57) ABSTRACT

A process for reducing the decay and build-up transient times of an intermittently operating oscillating circuit increases the data transmission rate of a transmission unit using such an oscillating circuit. In this process, the current and/or the voltage are held at their maximum values when the excitation voltage for the oscillating circuit is interrupted. This eliminates the decay of the oscillating circuit amplitudes. When the excitation voltage is switched on again, the oscillating circuit continues oscillating at its maximum amplitude without delay. The data transmission rate is increased because the decay or starting times are eliminated.

24 Claims, 2 Drawing Sheets

PROCESS FOR REDUCING THE DECAY AND TRANSIENT TIMES OF OSCILLATING CIRCUITS

BACKGROUND

1. Field of the Invention

The present invention relates to a process for reducing the decay and start-up transient times of oscillating circuits.

2. Description of the Related Technology

The excitation voltage is switched on and off quickly in oscillating circuits working in intermittent operation. As well as these two stable states, transient states also occur during which the amplitude of the oscillation decays or is built up again. The faster the switching processes take place in a given time period, the greater the proportion of the times during which the oscillation decays or starts again compared to the times in which the oscillating circuit is in a stable state. In order to calculate the proportion of time taken by the transient states:

$$U = U\text{max} \cdot exp(n \cdot p/Q) \tag{1}$$

provides an exponential description for the decay behavior of the voltage in the oscillating circuit, in which n is the number of periods and Q the quality of the oscillating circuit. From the assumption that the oscillation has decayed when the amplitude has fallen to 10% of the maximum value, equation (2) gives at least 10 periods as the number of periods required for this with a quality of Q=14:

$$n = Q/p \cdot |In(U/U\text{max})| = 14/p \cdot |In(10\%/100\%)| = 10 \tag{2}$$

Furthermore, equation (2) shows that the number of periods required also increases linearly as the quality increases. An oscillating circuit frequency of, for example, 100 kHz gives a decay time of 100 µs. This doubles to 200 µs when the starting time is taken into account, provided that the starting time is based on approximately the same functional relationship used for calculating the decay time.

Transmitting and receiving units used for transferring data are an important area of application for systems with oscillating circuits working in intermittent operation. For this purpose the oscillating circuit is switched on and off in the transmission units. All the decay and starting times in the oscillating circuit reduce the data transmission rate because the transmission gaps are increased. In the case of digital data transmission at a frequency of, for example, several hundred kHz, the amount of time in the stable state is of the same order as the amount of time in the transient states. A high data transmission rate is very important for use in the field of contactless identification, particularly in the automotive field for the authentication process of transponder and base unit, because the maximum period of time available for the entire process is only 150 ms. If the transponder is supplied with energy from the base unit by inductive means, the transient states of the oscillating circuits lengthen the times during which the transponder cannot pick up any energy from the field of the base unit.

Processes which function according to the previous state of the art are known, for example, from the data book of TEMIC Semiconductor GmbH, 1999, p. 404, FIG. 4. The circuit arrangement shown for implementing the process is used in the field of contactless identification systems for triggering oscillating circuit coils in the base units in order to transfer the data and energy to the transponders. According to page 338 of the data book, at an oscillating circuit frequency of 130 kHz the transmission gaps of the base unit lie between 160 µs and 400 µs, depending upon the quality of the oscillating circuit used. The duration of the authentication process between transponder and base unit is at least 50 ms, and this increases up to 120 ms as the quality of the transmission circuits used increases.

The disadvantage of the previous processes for driving the oscillating circuits is that the transient states reduce the data transmission rates of oscillating circuits working in intermittent operation. This results in increased times for the authentication process in the field of contactless identification systems. If the transponder is supplied with energy from the base unit by inductive means, the energy transfer to the transponder is reduced by the longer transmission gaps. The distance between the base unit and transponder, which lies in the range of a few cm, is thus reduced.

SUMMARY OF THE INVENTION

The object of the present invention is to specify a process with which the build-up and decay times in oscillating circuits can be significantly reduced in order to increase the data transmission rate between transmission and receiving units. A further object of the invention is to specify a circuit arrangement for implementing the process which can be manufactured easily and economically.

The above objects have been achieved according to the invention in a process for reducing the decay and build-up transient times in an oscillating circuit that operates intermittently and that has at least one capacitor, at least one coil, a control unit which excites the oscillating circuit, at least one switching element, and a current source or a voltage source. The particular features of the invention will be described next.

The process according to the invention will first be explained for the case in which the current is held at its maximum value. When the excitation voltage is interrupted by a switching element driven by a control unit, which excites the oscillating circuit, a current source is linked to the coil of the oscillating circuit which holds the current through the coil at its maximum value. When the excitation voltage is switched on again by the control unit by means of the switching element, the link between the current source and the oscillating circuit is separated again, and the oscillating circuit can continue oscillating at its maximum amplitude without delay. This arrangement is particularly advantageous because the blocking property of the capacitor means that the oscillating circuit does not need to be separated to connect the current source.

A further implementation of the process according to the invention can be achieved by holding the voltage. To do this, when the excitation voltage is interrupted by a first switching element, a control unit, which excites the oscillating circuit, separates the link between coil and capacitor, and links a voltage source to the capacitor by means of a second switching element in order to hold the voltage at the capacitor at its maximum value. When the excitation voltage is switched on again, the control unit remakes the link between the coil and the capacitor by means of the first switching element, and separates the voltage source from the oscillating circuit by means of the second switching element so that the oscillating circuit can immediately continue oscillating at its maximum amplitude.

BRIEF DESCRIPTION OF THE FIGURES

The invention is described and explained in the following by means of the drawings, FIGS. 1 to 4. They show.

DESCRIPTION OF THE PREFERRED EMBODIMENTS

Figure 1:
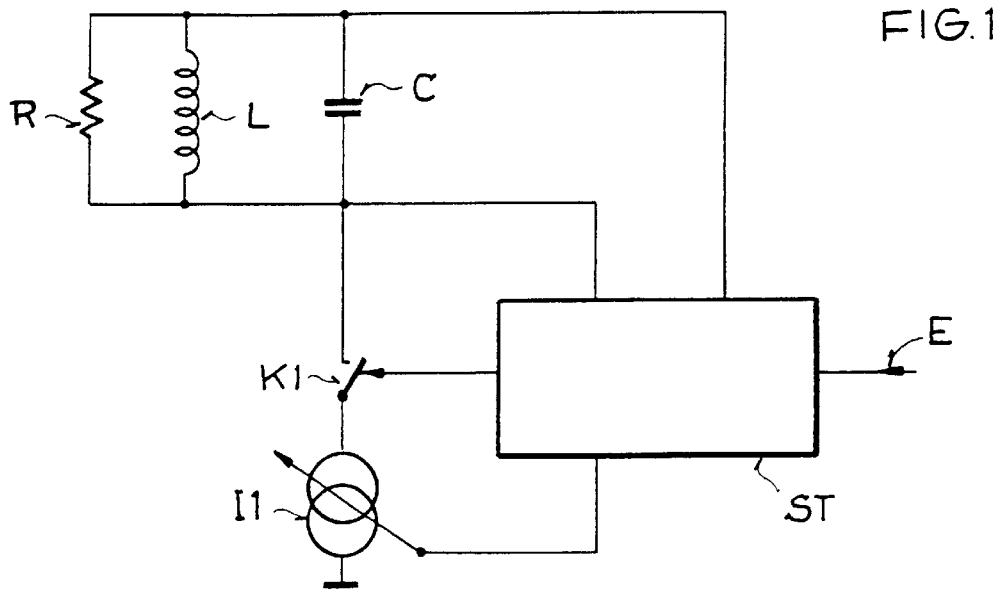
FIG. 1 A first embodiment of the invention for maintaining the current in a parallel oscillating circuit, FIG. 2 A second embodiment of the invention for maintaining the voltage in a parallel oscillating circuit, FIG. 3 A third embodiment of the invention for maintaining the current in a serial oscillating circuit, FIG. 4 A final embodiment of the invention for maintaining the voltage in a serial oscillating circuit.

The block diagram in FIG. 1 shows a first advantageous implementation of the process according to the invention for a parallel oscillating circuit. This consists of a coil L, a capacitor C and a resistor R, and is excited with its resonant frequency by a control unit ST which is linked to the oscillating circuit. Furthermore, a switching element K1 is connected to the oscillating circuit, this switching element links a controllable current source I1 to the oscillating circuit, this current source is connected to the reference potential. The control inputs of the current source I1 and of the switching element K1 are each linked to the control unit ST. The control unit ST also possesses an input E over which it can be triggered. The starting point of the functional description is the state in which the control unit ST excites the oscillating circuit with its resonant frequency. In this state, the switching element K1 is open. If the control unit ST is triggered by an input signal, the control unit interrupts the excitation of the oscillating circuit at the time at which the current through the coil L has reached its maximum value. At the same time, the control unit ST links the current source I1 to the oscillating circuit by means of the switching element K1 in order to hold the current through the coil L at its maximum value. To do this, the current of the current source I1 is set by the control unit ST such that it corresponds to the sum of the two currents through the resistor R and the coil L. The current flow through the capacitor is negligible because, in the case of direct current, the capacitor C has an infinitely high resistance. If the control unit ST is triggered once again by an input signal, the control unit ST separates the current source I1 from the oscillating circuit by means of the switching element K1, and the excitation of the oscillating circuit is resumed at this time, and the oscillating circuit can continue to oscillate at its maximum amplitude.

Figure 2:
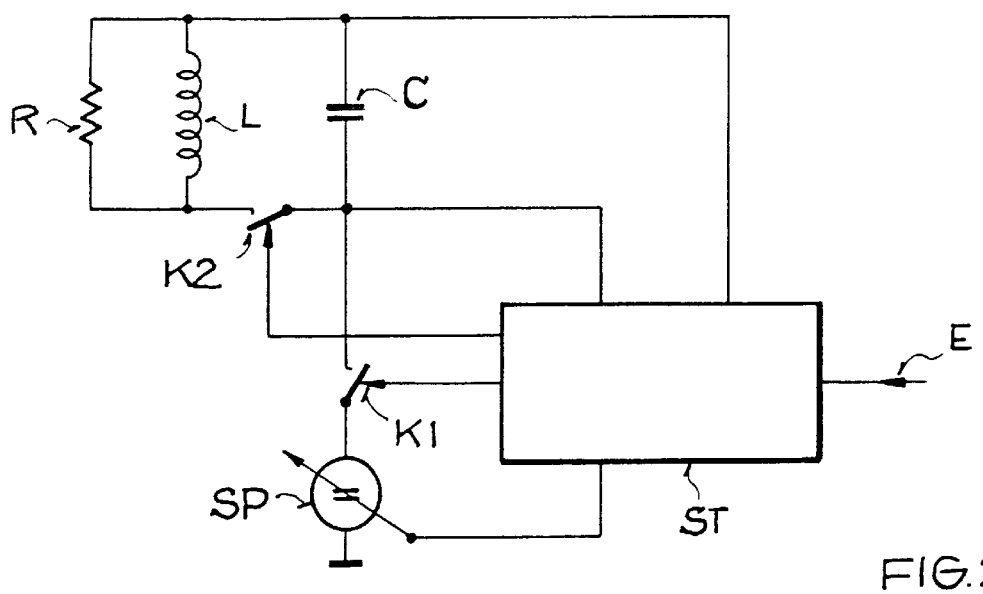

The block diagram in FIG. 2 shows a further embodiment of the process according to the invention for a parallel oscillating circuit. In contrast to the arrangement shown in FIG. 1, the voltage of the oscillating circuit is held instead of the current. To do this, a parallel oscillating circuit consisting of a coil L, a capacitor C and a resistor R, is excited with its resonant frequency by a control unit ST which is linked to the oscillating circuit. In order to be able to separate the link between the coil L and the capacitor C, they are connected by means of a switching element K2. Furthermore, a switching element K1 is connected to the oscillating circuit, this switching element links a controllable voltage source SP to the oscillating circuit, this voltage source SP is connected to the reference potential. The control inputs of the voltage source SP and the switching element K1 are linked for their part to the control unit ST. The control unit ST also possesses an input E over which it can be triggered. When it has been triggered, the task of the control unit ST is to interrupt the excitation of the oscillating circuit at the time at which the voltage at capacitor C has reached its maximum value, and at the same time to link the voltage source SP to the oscillating circuit by means of the switching element K1, and to break the link between the coil L on one side and the capacitor C and the resistor R on the other side so that no current can flow over the two passive components. The voltage of the voltage source SP is set by the control unit ST at a level corresponding to that of the voltage at the capacitor C. If the control unit ST is triggered again, the voltage source SP is separated from the oscillating circuit by the switching element K1, and the link between the capacitor C, the coil L and the resistor R is restored by means of the switching element K2, and the excitation of the oscillating circuit is resumed at this time so that the oscillating circuit can continue to oscillate at its maximum amplitude. There is no need to maintain the voltage source SP provided that the capacitor C only has very low leak currents and the excitation of the oscillating circuit is only interrupted for a short time. The circuit arrangement is considerably simpler under these conditions.

Figure 3:
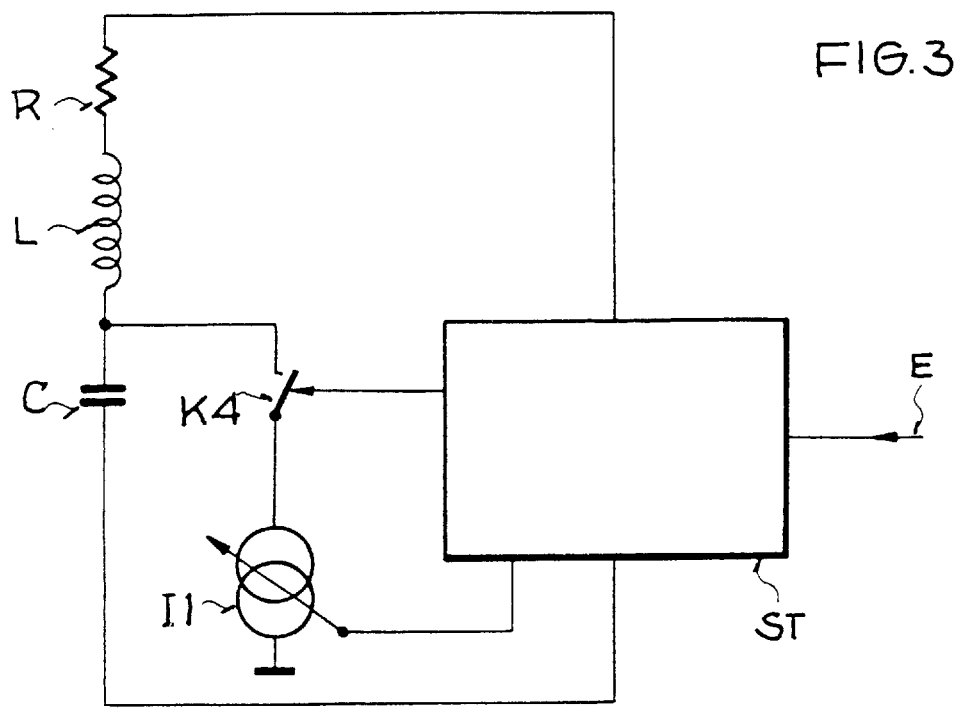

The block diagram in FIG. 3 shows an implementation of the process according to the invention for a serial oscillating circuit. This consists of a resistor R, a coil L and a capacitor C which are linked in a series circuit, and is excited with its resonant frequency by a control unit ST which is linked to the oscillating circuit. Furthermore, a switching element K4 is connected to the coil L and capacitor C, this switching element links a controllable current source I1 to the oscillating circuit, this current source is linked to the reference potential. The control inputs of the current source I1 and the switching element K4 are linked for their part to the control unit ST. Furthermore, the control unit ST also has an input E over which it can be triggered. When it has been triggered by a signal, the task of the control unit ST is to interrupt the excitation of the oscillating circuit at the time at which the current through the coil L has reached its maximum value, and at the same time to link the current source I1 with the oscillating circuit by means of the switching element K4, so that the current through the coil L is held at this value. In the case of direct current, the capacitor C has an infinitely high resistance, so the current flow through the capacitor C can be disregarded. If the control unit ST is triggered once more, the current source I1 is separated from the oscillating circuit by the switching element K1, and the excitation of the oscillating circuit is resumed at this time so that the oscillating circuit continues to oscillate at its maximum amplitude.

Figure 4:
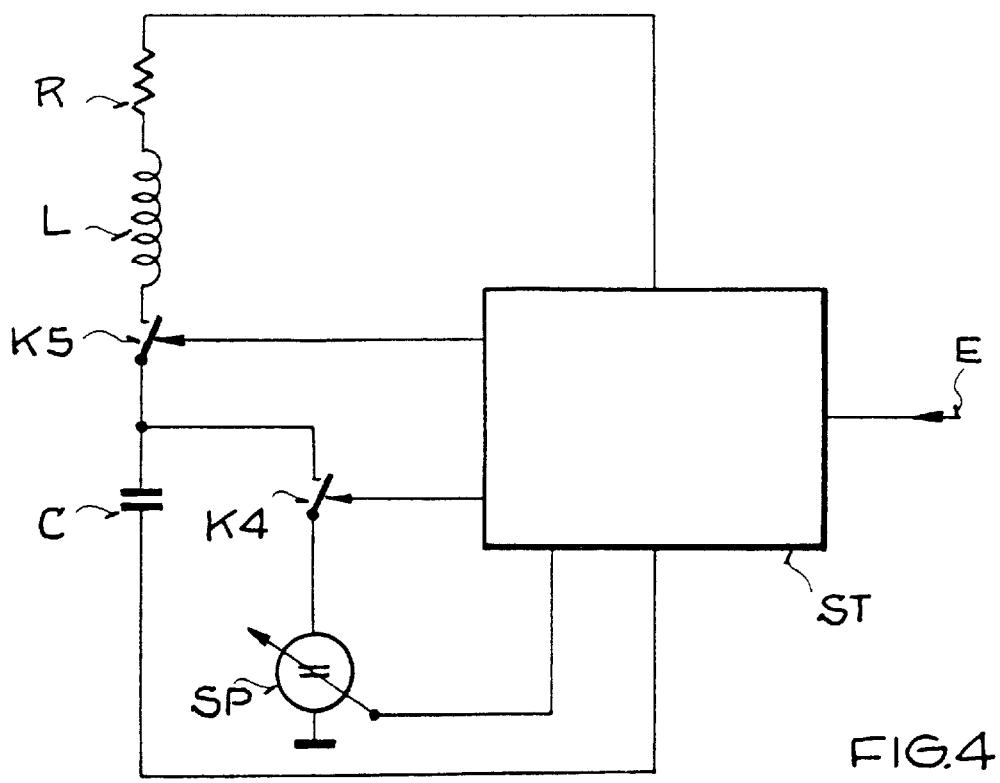

The block diagram in FIG. 4 shows a further implementation of the process according to the invention for a serial oscillating circuit in which, in contrast to the arrangement shown in FIG. 3, the voltage of the oscillating circuit is now held instead of the current. To do this, a serial oscillating circuit consisting of a coil L, a capacitor C and a resistor R is excited with its resonant frequency by a control unit ST which is linked to the oscillating circuit. In order to be able to separate the link between the coil L and the capacitor C, they are connected by means of a switching element K5. Furthermore, a switching element K4 is connected to the oscillating circuit, this switching element links a controllable voltage source SP to the oscillating circuit, this voltage source is connected to the reference potential. The control inputs of the voltage source SP, the switching element K4 and the switching element KS are each linked to the control unit ST. The control unit ST also possesses an input E over which it can be triggered. When it has been triggered, the task of the control unit ST is to interrupt the excitation of the oscillating circuit at the time at which the voltage at capacitor C has reached its maximum value, and at the same time to link the voltage source SP to the oscillating circuit by means of the switching element K4, and to break the link between coil L and capacitor C and the resistor R by means of the switching element K5 so that no current can flow over the two passive components. The voltage of the voltage source SP is set by the control unit ST at a level corresponding to that of the voltage at the capacitor C. If the control unit ST is triggered again, the control unit ST separates the voltage source SP from the oscillating circuit by means of the switching element K4, and restores the link between on the one side the capacitor C and on the other side the coil L and the resistor R by means of the switching element KS, and the excitation of the oscillating circuit is resumed at this time so that the oscillating circuit can continue to oscillate at its maximum amplitude. There is no need to connect the voltage source SP provided that the capacitor C only has very low leak currents and the excitation of the oscillating circuit is only interrupted for a short time. This means that the switching element K4 and a control output of the control unit ST can be dispensed with, which considerably simplifies the circuit arrangement.

In the case of the embodiments described, it is particularly advantageous to use transistors as switching elements, especially MOS transistors. Furthermore, the current and voltage sources need not be designed as controllable sources provided that the magnitude of the current and voltage amplitudes in the oscillating circuit is sufficiently constant. In this respect, it should be pointed out that the process according to the invention does not place any special requirements upon the voltage and current sources.

The process according to the invention can be used with particular advantage in systems for wire-bound and wireless data transmission because the data transmission rate in the oscillating circuits working in intermittent operation is significantly increased by the shortened transmission pauses. Furthermore, the use of the process according to the invention completes the authentication process in contactless identification systems more quickly, whereby the preferred application is in the base unit because it has its own power supply. The shortened transmission pauses enable a higher energy transfer from the base unit to the transponder, therefore their spacing is increased.

By avoiding the transient states, the data transmission rate will no longer be reduced as a result of such transient states. Therefore, even oscillating circuits of high quality, that is in the range of 100, can be used in transmission and receiving units in the field of contactless identification systems. According to the previous state of the art, equation (2) gave decay times in the range of a few milliseconds for frequencies around 100 kHz, and could therefore only be used with difficulty in this field. Oscillating circuits of high quality can be used with the process according to the invention, and thus generate amplitudes of over 100 V in the transmission circuit from the low supply voltages of the base units. The energy transfer thus increases in transponders supplied by inductive means, and consequently the distance from the transponder to the base unit can also be increased.

What is claimed is:

1. Process for reducing the decay and transient times in oscillating circuits working in intermittent operation, which have at least one capacitor (C) and at least one coil (L), with a control unit (ST) which excites the oscillating circuit, with at least one electrical switching element (K1) and a current source (SI), wherein the coil current is held at its maximum value by the control unit (ST) connecting the current source (SI) to the coil (L) by means of the electrical switching element (K1) when the excitation of the oscillating circuit is interrupted, and the control unit (ST) separates the current source (SI) from the coil (L) by means of the electrical switching element (K1) when the excitation of the oscillating circuit is switched on.

2. Process according to claim 1 wherein transistors are preferably used as switching elements (K1, K2, K3).

3. Process according to claim 2 wherein MOS transistors are preferably used as switching elements (K1, K2, K3).

4. The process according to claim 3, further comprising exciting the oscillating circuit to provide an oscillating signal that carries modulated data, and transmitting the oscillating signal in a wireless manner.

5. The process according to claim 3, further comprising exciting the oscillating circuit to provide an oscillating signal that carries modulated data, and transmitting the oscillating signal via a transmission wire.

6. The process according to claim 3, further comprising exciting the oscillating circuit to provide an oscillating signal that carries modulated data, and transmitting the oscillating signal at a data transmission rate between a transmission unit and a receiving unit, wherein the data transmission rate is increased through the process by reducing the decay and transient times of the oscillating circuit.

7. The process according to claim 3, further comprising exciting the oscillating circuit to provide an oscillating signal that carries modulated data, and transmitting the oscillating signal at a data transmission rate between a base unit and a transponder, wherein the data transmission rate is increased through the process by reducing the decay and transient times of the oscillating circuit.

8. The process according to claim 1, further comprising exciting the oscillating circuit to provide an oscillating signal that carries modulated data, and transmitting the oscillating signal in a wireless manner.

9. The process according to claim 1, further comprising exciting the oscillating circuit to provide an oscillating signal that carries modulated data, and transmitting the oscillating signal via a transmission wire.

10. The process according to claim 1, further comprising exciting the oscillating circuit to provide an oscillating signal that carries modulated data, and transmitting the oscillating signal at a data transmission rate between a transmission unit and a receiving unit, wherein the data transmission rate is increased through the process by reducing the decay and transient times of the oscillating circuit.

11. The process according to claim 1, further comprising exciting the oscillating circuit to provide an oscillating signal that carries modulated data, and transmitting the oscillating signal at a data transmission rate between a base unit and a transponder, wherein the data transmission rate is increased through the process by reducing the decay and transient times of the oscillating circuit.

12. A process for reducing at least a start-up transient time in an intermittently operating oscillating circuit including a capacitor and a coil, in a circuit arrangement further including a current source that is selectively connected to and disconnected from the oscillating circuit through a switch element, wherein the process comprises the following steps:

a) exciting the oscillating circuit to oscillate, while disconnecting the current source from the oscillating circuit by means of the switch element;

b) ceasing the exciting of the oscillating circuit, and connecting the current source to the oscillating circuit by means of the switch element to drive a current from the current source through the coil; and c) repeating the steps a) and b).

13. Process for reducing the decay and transient times in oscillating circuits working in intermittent operation, which have at least one capacitor (C) and at least one coil (L), with a control unit (ST) which excites the oscillating circuit, with at least one electrical switching element (K1, K2) and a voltage source (SP), wherein the control unit (ST) separates the link between the coil (L) and the capacitor (C) by means of a first electrical switching element (K2) when the excitation of the oscillating circuit is interrupted, and links the voltage source (SP) to the capacitor (C) by means of a second switching element (K1) in order to hold the voltage at the capacitor (C) at the maximum value, and the control unit (ST) links the coil (L) and the capacitor (C) by means of the first electrical switching element (K2) when the excitation is switched on, and separates the voltage source (SP) from the capacitor (C) by means of the second switching element (K1).

14. Process according to claim 13 wherein transistors are preferably used as switching elements (K1, K2, K3).

15. Process according to claim 14 wherein MOS transistors are preferably used as switching elements (K1, K2, K3).

16. The process according to claim 15, further comprising exciting the oscillating circuit to provide an oscillating signal that carries modulated data, and transmitting the oscillating signal in a wireless manner.

17. The process according to claim 15, further comprising exciting the oscillating circuit to provide an oscillating signal that carries modulated data, and transmitting the oscillating signal via a transmission wire.

18. The process according to claim 15, further comprising exciting the oscillating circuit to provide an oscillating signal that carries modulated data, and transmitting the oscillating signal at a data transmission rate between a transmission unit and a receiving unit, wherein the data transmission rate is increased through the process by reducing the decay and transient times of the oscillating circuit.

19. The process according to claim 15, further comprising exciting the oscillating circuit to provide an oscillating signal that carries modulated data, and transmitting the oscillating signal at a data transmission rate between a base unit and a transponder, wherein the data transmission rate is increased through the process by reducing the decay and transient times of the oscillating circuit.

20. The process according to claim 13, further comprising exciting the oscillating circuit to provide an oscillating signal that carries modulated data, and transmitting the oscillating signal in a wireless manner.

21. The process according to claim 13, further comprising exciting the oscillating circuit to provide an oscillating signal that carries modulated data, and transmitting the oscillating signal via a transmission wire.

22. The process according to claim 13, further comprising exciting the oscillating circuit to provide an oscillating signal that carries modulated data, and transmitting the oscillating signal at a data transmission rate between a transmission unit and a receiving unit, wherein the data transmission rate is increased through the process by reducing the decay and transient times of the oscillating circuit.

23. The process according to claim 13, further comprising exciting the oscillating circuit to provide an oscillating signal that carries modulated data, and transmitting the oscillating signal at a data transmission rate between a base unit and a transponder, wherein the data transmission rate is increased through the process by reducing the decay and transient times of the oscillating circuit.

24. A process for reducing at least a start-up transient time in an intermittently operating oscillating circuit including a capacitor and a coil, in a circuit arrangement further including a voltage source that is selectively connected to and disconnected from the capacitor through a first switch element, and a second switch element that selectively connects and disconnects the coil and the capacitor relative to each other, wherein the process comprises the following steps:

a) exciting the oscillating circuit to oscillate, while disconnecting the voltage source from the capacitor by means of the first switch element and connecting the coil to the capacitor by means of the second switch element;

b) ceasing the exciting of the oscillating circuit, and connecting the voltage source to the capacitor by means of the first switch element and disconnecting the coil from the capacitor and from the voltage source by means of the second switch element, to apply a voltage from the voltage source to the capacitor; and repeating the steps a) and b).

* * * * *

UNITED STATES PATENT AND TRADEMARK OFFICE
CERTIFICATE OF CORRECTION

PATENT NO. : 6,593,824 B2　　　　　　　　　　　　　　　　　　Page 1 of 1
DATED : July 15, 2003
INVENTOR(S) : Hanselmann It is certified that error appears in the above-identified patent and that said Letters Patent is hereby corrected as shown below:

Column 2,
Between lines 29 and 30, insert the following paragraph:

-- According to this, the essence of the invention is that, when the excitation voltage of an oscillating circuit is interrupted, the amplitudes of one of the physical quantities which characterize the oscillation are held at their maximum values until the excitation voltage of the oscillating circuit is switched on again. This means that the oscillating circuit can continue oscillating at the maximum amplitude of the quantity which has been maintained without any delay. The applicant's investigations have shown that the current or the voltage can be used as characteristic quantities and that one of these quantities can be held both in parallel and serial oscillating circuits. It is particularly advantageous if the oscillating circuits are excited with their resonant frequency. --.

Column 4,
Line 53, after "element", replace "KS" by -- K5 --.

Column 5,
Line 3, after "element", replace "KS," by -- K5, --.

Signed and Sealed this

Seventh Day of October, 2003

JAMES E. ROGAN
*Director of the United States Patent and Trademark Office*